United States Patent [19]

Hopper et al.

[11] Patent Number: 4,737,113
[45] Date of Patent: Apr. 12, 1988

[54] JACK ASSEMBLY HAVING A UNITARY HOUSING

[75] Inventors: Scott Hopper; Gary J. Gunell, both of Seattle, Wash.

[73] Assignee: Telzon, Inc., Seattle, Wash.

[21] Appl. No.: 864,830

[22] Filed: May 19, 1986

[51] Int. Cl.$^4$ .............................................. H05K 1/00
[52] U.S. Cl. ...................................... 439/78; 439/696; 439/701; 439/752; 439/668
[58] Field of Search ...... 339/198 R, 198 G, 198 G A, 339/198 S, 198 P, 47–49, 182, 183, 143 R, 17 C, 17 LC, 177 R, 177 E, 14 R, 14 P; 439/731, 752, 668, 669

[56] References Cited

U.S. PATENT DOCUMENTS

| | | | |
|---|---|---|---|
| 2,901,724 | 8/1959 | Lahr | 339/183 |
| 3,393,449 | 7/1968 | Garcia | 339/17 C |
| 3,852,703 | 12/1974 | Carney et al. | 439/668 |
| 4,175,810 | 11/1979 | Holt et al. | 339/17 C |
| 4,230,392 | 10/1980 | Leonard, Jr. et al. | 439/668 |
| 4,451,107 | 5/1984 | Dola et al. | 339/143 R |
| 4,548,447 | 10/1985 | Dinsmore | 339/182 R |
| 4,548,453 | 10/1985 | Mummey et al. | 339/17 C |
| 4,571,014 | 2/1986 | Robin et al. | 339/143 R |

Primary Examiner—Gil Weidenfeld
Assistant Examiner—David Pirlot
Attorney, Agent, or Firm—Weingarten, Schurgin, Gagnebin & Hayes

[57] ABSTRACT

A telephone jack assembly having a modular unitary housing, and jack field comprising a plurality of jack assemblies. Each jack assembly includes a plurality of jack contacts for engaging and receiving a telephone plug in a plurality of positions, wherein the jack contacts are retained by a unitary housing formed to maintain the jack contacts in physical alignment for electrical contact to the plugs when fully seated. The unitary housing includes recesses therein to accurately retain the jack contacts in precise height, width and depth positions relative to the plugs inserted therein, replacing the numerous elements and spacers heretofore used in a telephone jack assembly. The individual jack assemblies are then connected to external wiring connecting blocks by flexible printed circuits having constant impedance path pairs, which replace the individually hand-wired twisted-pair construction previously used.

17 Claims, 2 Drawing Sheets

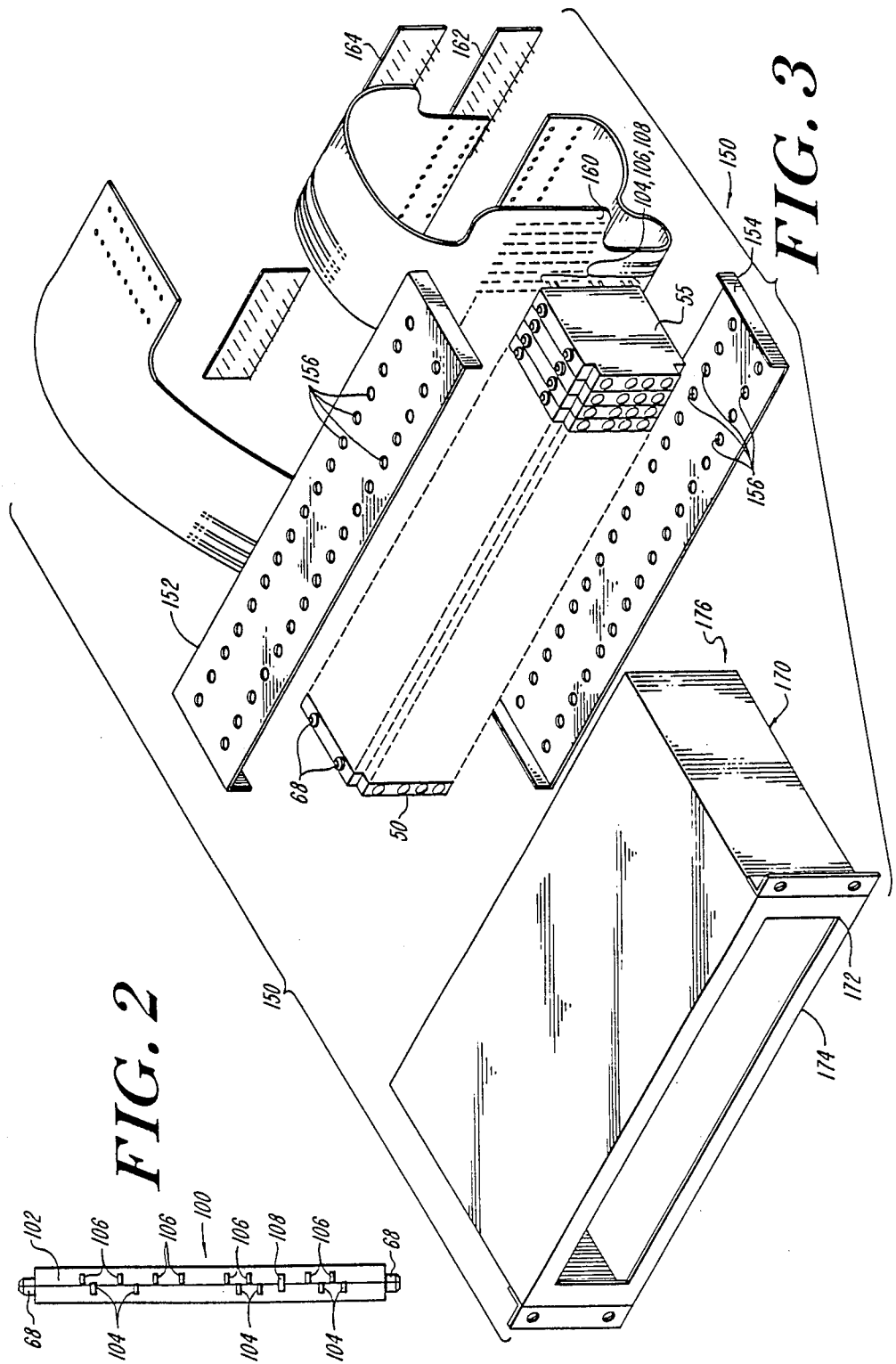

JACK ASSEMBLY HAVING A UNITARY HOUSING

FIELD OF THE INVENTION

The present invention relates to telephone jacks and, in particular, to modular telephone jacks configured to provide a jack field.

BACKGROUND OF THE INVENTION

Jacks and jack fields used in patch panel interconnection systems for redirecting signal paths typically have hundreds of components which are tediously hand-wired and hand-assembled. Each jack assembly physically retains the plug, as well as making electrical contact to the plug tip, ring and sleeve circuits. Typically, each individual jack assembly has three positions in which to receive a plug. Furthermore, the individual jack often includes switch contacts which make or break circuits depending upon the presence of a plug in the particular jack position. The jack and switch contacts are separated by insulating spacers to form a laminar subassembly, which is mounted to a jack frame into which the plug is inserted, to form the jack assembly. The jack elements and the spacers are held together with screws extending through the assembly, and must be carefully adjusted to a predetermined torque to maintain the desired alignment and avoid unwanted short circuits to the screw or adjacent jack elements.

The jack field comprises a large number of individual jack assemblies in a single enclosure. Heretofore, the jack field assembled from a plurality of individual jack assemblies, input/output and cross connect connector blocks, hand-wired twisted pair interconnections, and rack-mount enclosure, all hand assembled. Such patch panel systems are expensive and slow to manufacture and requiring precise control over assembly and component manufacture.

SUMMARY OF THE INVENTION

The present invention comprises a multi-position jack assembly having a plurality of jack contacts and a lamp socket contained in a unitary molded jack module, having a left and a right complementary side piece to accurately retain the jack contacts in precise position. Moreover, the complementary molded housing pieces have recesses to receive each of the jack contact elements without requiring skill on the part of the assembler. Furthermore, the recesses in the complementary left and right housing pieces have a specifically staggered recess pattern, where a particular recess corresponds to a specific jack contact element, thereby precluding the assembly of the jack contact in erroneous sequence.

The jack contact elements are further formed to engage a flexible printed circuit element having a plurality of constant impedance circuit pair traces to provide connection to the connecting blocks behind the jack field. The constant impedance is controlled by using coincident pair circuit traces on opposite sides of a two-layer flexible circuit board material to achieve a balanced pair of signal conductors.

The resulting jack field of multi-position telephone jacks may be assembled rapidly with a reduced number of components to provide a more economical and reliable product.

BRIEF DESCRIPTION OF THE DRAWING

These and other features of the present invention will be better understood by reading the following detailed description taken together with the drawing wherein:

FIG. 2 is a rear view of the jack of FIG. 1; and FIG. 3 is an assembly drawing of the jack field having a plurality of the individual jack assemblies of FIG. 1.

DETAILED DESCRIPTION OF THE PRESENT INVENTION

Figure 1:
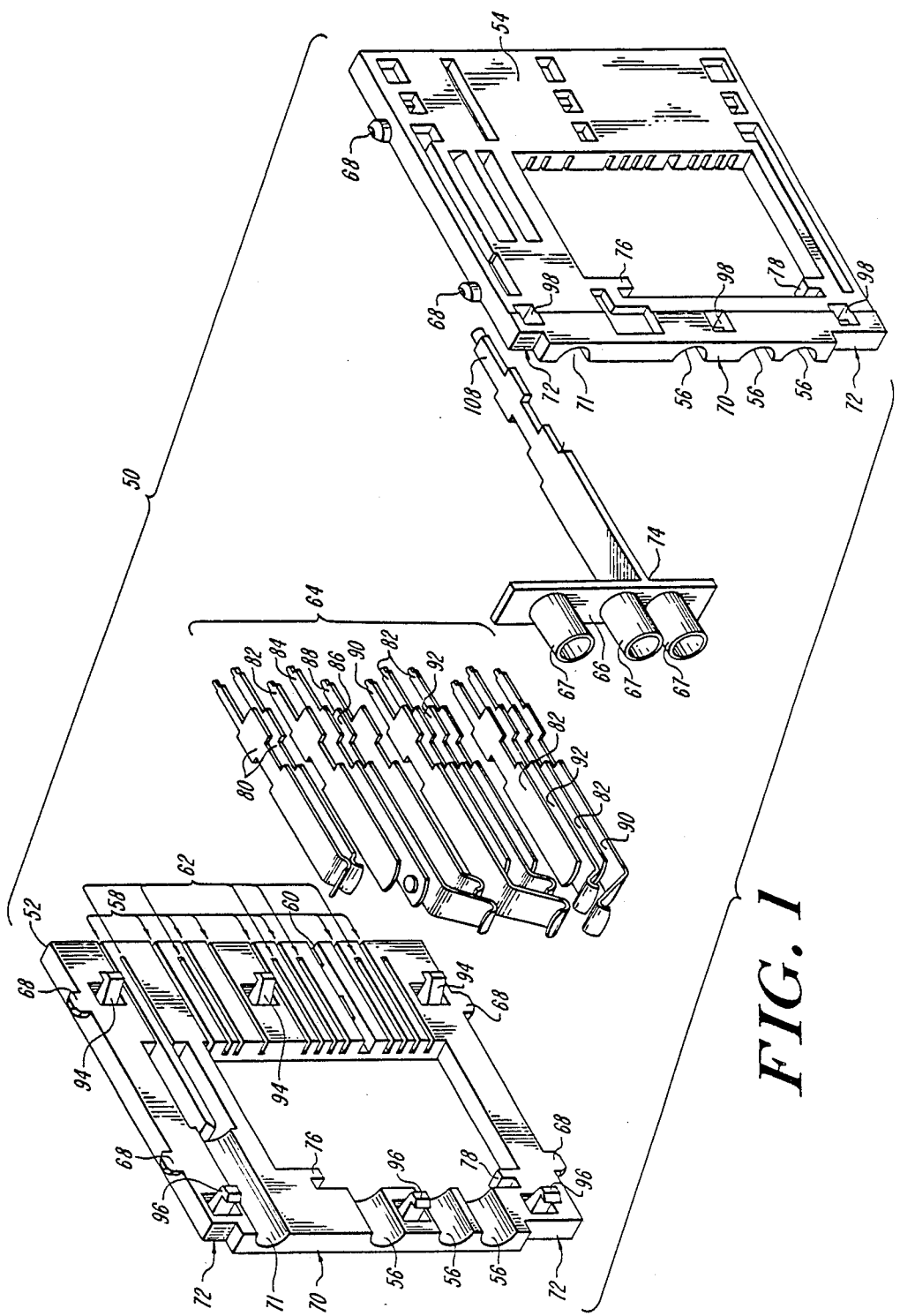
FIG. 1 is an exploded view of the multi-position jack assembly according to the present invention.

A three-position jack assembly 50 is shown in FIG. 1 wherein a unitary housing is formed by two complementary and mating side pieces 52 and 54. The side pieces 52 and 54 are preferably injection moulded from plastic which inherently includes all necessary constituent spacing and retaining components, without requiring any ancillary spacers or additional hardware. In particular, the housing elements 52 and 54 include a plurality of recesses 56, 58, 60 and 62 to receive the plurality of jack contacts 64 as well as the sleeve support or jack frame 66. The assembled unitary housing comprising complementary side pieces 52 and 54 also includes retain posts 68 which extend outward from the assembly to engage external supporting brackets to form the jack field discussed below. Moreover, the front 70 of each jack assembly is provided with shoulders 72 so that the plurality of modules forming a jack field may be accurately aligned into an opening 172, (FIG. 3) in the front panel.

The jack frame 66 having multiple plug receiving sleeves 67 for receiving the jack in one of three positions, is subjected to a bending moment at 74, which may result in fatigue and fracture of the jack frame over a period of usage. Appreciating the forces exerted thereon, the complementary side pieces 52 and 54 include retaining ears 76 and 78 thereon, to relieve the stresses from the jack frame at point 74. Therefore, the frame may be manufactured in a single, molded cast or welded assembly, wherein the stress is effectively transferred from the plug to the jack housing.

The plurality of jack contacts 64 include the jack contacts of different types, and also include lamp lead springs 80, rider springs with a contact, 82; push springs with a contact, 84; a major spring, 86; a minor spring 88; a major spring with a contact, 90, and a minor spring with a contact, 92. A lamp socket is provided by recesses 71 in the left and right module side pieces 52,54 in combination with the lamp lead springs, 80. These lamp and jack contacts are assembled to engage each jack position of the jack assembly 50 as desired.

The left and right sides 52 and 54 of the complementary housing pieces are aligned by alignment pins 94 and retained together by spring clips 96 which engage and secure the opposing side at 98.

A rear view 100 of the assembled jack is shown in FIG. 2, showing the offset of the plurality of jack contacts extending from the rear of the assembled unitary housing according to the present invention. The contacts 104 shown to the left of the center line 102 are the contacts inserted in the recesses 62 of FIG. 1 and; similarly, the contacts 106 disposed to the right of the center line 102 are the contacts received by recesses 58. The contact 108 of the jack frame 66 is typically somewhat larger in dimension than the contacts 104 and 102.

An assembly drawing of the jack field 150 of the present invention according to the present invention is shown in FIG. 3. For simplicity, representative numbers of jack assemblies, flexible cables, and pin connectors have been shown in FIG. 3. The jack field 150 comprises a plurality of individual jack assemblies 50 mounted side by side, having metal shield elements 55 therebetween to provide electrical shielding from circuit crosstalk. The individual jack assemblies 50 have retain posts 68 which are retained in holes 156 in upper and lower brackets 152 and 154. The circuit contacts 104, 106, 108 extending rearward from the individual jack assemblies 50 mate with a flexible circuit 160 having coincident paired conductors thereon providing a specified balance impedance, typically 100 ohms. The flexible printed circuit 160 terminates in wire wrap or other pin connectors, typically comprising an input-output connector 162 as well as a cross-connect pin connector 164.

The above-described jack field is typically enclosed in a rack mount housing 170, which includes a front panel 174 having an opening 172 which permits the front surfaces of the individual jack modules 50 to extend through the opening 172, to be flush with the front panel 174. The above-mentioned pin connectors 162, 164 are accessible from the rear 176 of the housing 170 for interconnection to other units or equipment, not shown.

Other embodiments, substitutions or modifications made by one skilled in the art are within the scope of the invention which is not to be limited except by the claims which follow.

What is claimed is:

1. A jack assembly defining a discrete electrical circuit and adapted for receiving at least one plug, comprising:
   a jack frame having a plurality of plug receiving sleeves for receiving the at least one plug and a circuit contact end, and wherein said plurality of plug receiving sleeves are stacked with respect to one another;
   a first and second plurality of jack contacts, each of said first and second plurality of jack contacts having a plug contact end and a circuit contact end, and wherein selected ones of said plug contact ends electrically contact; and
   a unitary housing for receiving and retaining said first and second plurality of jack contacts and said jack frame in physical alignment with said circuit contact ends in a predetermined stacked relationship wherein predetermined ones of said plug contact ends of said first and second plurality of jack contacts electrically contact the at least one plug when fully seated in one of said plurality of plug receiving sleeves to complete the discrete electrical circuit of said jack assembly,
   said unitary housing having first and second complementary side pieces mateable to form said unitary housing, each of said first and second complementary side pieces including a first and second plurality of recesses and a third recess integrally formed therein, and wherein said first and second plurality of recesses and said third recess receive said circuit contact ends of said first and second plurality of jack contacts and said jack frame, respectively, in said predetermined stacked relationship with respect to one another with said circuit contact ends of said first plurality of jack contacts offset with respect to said first complementary side piece and said circuit contact ends of said second plurality of jack contacts offset with respect to said second complementary side piece.

2. A jack assembly defining a discrete electrical circuit and adapted for receiving at least one plug, comprising:
   a jack frame having a plurality of plug receiving sleeves for receiving the at least one plug and a circuit contact end, and wherein said plurality of plug receiving sleeves are stacked with respect to one another;
   a unitary housing having first and second complementary side pieces mateable to form said unitary housing, each of said first and second complementary side pieces including a first and second plurality of recesses and a third recess integrally formed therein, said unitary housing receiving and retaining said jack frame therein; and
   a first and second plurality of jack contacts, each of said first and second plurality of jack contacts having a plug contact end and a circuit contact end, wherein
   said first and second plurality of recesses of said first and second complementary side pieces of said unitary housing are positioned to allow predetermined ones of said plug contact ends of said first and second plurality of jack contacts to provide electrical contact to the at least one plug when fully seated in one of said plurality of plug receiving sleeves of said jack assembly, and wherein said first and second plurality of recesses and said third recess can only receive said circuit contact ends of said first and second plurality of jack contacts and said jack frame, respectively, in a predetermined stacked relationship with respect to one another with said circuit contact ends of said first plurality of jack contacts offset with respect to said first complementary side piece and said circuit contact ends of said second plurality of jack contacts offset with respect to said second complementary side piece, and
   said circuit contact ends of said first and second plurality of jack contacts and said jack frame are disposed to mate with a printed circuit.

3. The jack assembly of claim 1, wherein
said first and second plurality of recesses and said third recess integrally formed in said first and second complementary side pieces of said unitary housing provide alignment of said circuit contact ends of said first and second plurality of jack contacts and said jack frame in said predetermined stacked relationship, said first and second plurality of recesses and said third recess having selected height, width and depth relationships wherein only said circuit contact ends of said first plurality of jack contacts are receivable in said first plurality of recesses, only said circuit contact ends of said second plurality of jack contacts are receivable in said second plurality of recesses and only said circuit contact end of said jack frame is receivable in said third recess.

4. The jack assembly of claim 3, wherein said unitary housing formed by mating said first and second complementary side pieces further includes a lamp recess integrally formed in each said first and second complementary side pieces for receiving a removable lamp; and lamp contact means disposed in respective ones of said first and second plurality of recesses for electrically engaging the removable lamp when the removable lamp is fully seated in said lamp recesses of said first and second complementary side pieces.

5. The jack assembly of claim 3, further including:

auxiliary contact means depending from said first and second complementary side pieces for coacting with said jack frame retained in said unitary housing when the at least one plug is seated in said jack assembly to relieve stresses induced in said jack frame.

6. The jack assembly of claim 3, wherein selected ones of said plurality of plug receiving sleeves of said jack frame of said individual jack assembly receive corresponding ones of a plurality of plugs wherein said plug contact ends of said first and second plurality of jack contacts electrically contact the corresponding ones of the plurality of plugs.

7. The jack assembly of claim 1, wherein said first and second plurality of recesses are integrally formed in said first and second complementary side pieces of said unitary housing to receive only said circuit contact ends of said first and second plurality of jack contacts respectively, in said predetermined stacked relationship, and wherein said predetermined stacked relationship causes said circuit contact ends of said first and second plurality of jack contacts to be aligned in a predetermined offset relationship along a centerline defined between said first and second complementary side pieces as mated to form said unitary housing and said circuit contact ends of said first and second plurality of jack contacts and said jack frame are disposed to engage a printed circuit.

8. The jack assembly of claim 7, wherein said unitary housing comprises a molded housing.

9. The jack assembly of claim 7 wherein said first complementary side piece of said unitary housing includes alignment means for aligning said first and second complementary side pieces, and said second complementary side piece of said unitary housing includes means for mating with said alignment means to form said unitary housing.

10. The jack assembly of claim 9 wherein each of said first and second complementary side pieces further includes retain posts disposed on opposed edges thereof and extending outwardly from said jack assembly to coact with external elements to maintain said jack assembly in a predetermined position.

11. A modular jack field for receiving a plurality of plugs, comprising:

a plurality of individual jack assemblies, each individual jack assembly constituting a discrete electrical circuit and having a jack frame having a plurality of plug receiving sleeves for receiving at least one of the plurality of plugs and a circuit contact end, and wherein said plurality of plug receiving sleeves are stacked with respect to one another, a first and second plurality of jack contacts, each of said first and second plurality of jack contacts having a plug contact end and a circuit contact end, and wherein selected ones of said plug contact ends electrically contact the at least one plug to complete the discrete electrical circuit of said individual jack assembly, and a unitary housing having first and second complementary side pieces mateable to form said unitary housing, each of said first and second complementary side pieces including a first and second plurality of recesses and a third recess integrally formed therein, and wherein said jack frame is disposed within said unitary housing with said circuit contact end disposed in said third recess and said first and second plurality of recesses receive said circuit contact ends of said first and second plurality of jack contacts, respectively, in a predetermined stacked relationship with respect to one another with said circuit contact ends of said first plurality of jack contacts offset with respect to said first complementary side piece and said circuit contact ends of said second plurality of jack contacts offset with respect to said second complementary side piece, and further wherein each of said plurality of individual jack assemblies receives at least one of the plurality of plugs, and wherein said plurality of individual jack assemblies are assembled in juxtaposition to provide said modular jack field;

a plurality of pin connector blocks and wherein said circuit contact ends of said first and second plurality of jack contacts and said jack field of each individual jack assembly of said plurality of individual jack assemblies are electrically connected to said plurality of pin connector blocks; and means to retain said plurality of individual jack assemblies in juxtaposition to provide said modular jack field.

12. The modular jack field of claim 11, further comprising a plurality of conductive electrical shield elements and wherein one of said plurality of conductive electrical shield elements is interposed between adjacent individual jack assemblies to reduce electrical interference between the discrete electrical circuits of adjacent individual jack assemblies.

13. The modular jack field of claim 11, further comprising a flexible printed circuit for electrical connection of said circuit contact ends of said plurality of individual jack assemblies to the plurality of pin connector blocks, and retain posts extending outwardly from opposed edges of said first and second complementary side pieces of said unitary housing of each individual jack assembly, and wherein said retain means includes upper and lower brackets having aligned holes therein to receive said retain posts of each individual jack assembly to assemble said plurality of individual jack assemblies in juxtaposition to provide said modular jack field.

14. The modular jack field of claim 13, wherein said flexible printed circuit comprises a plurality of printed coincident pair of circuit traces, and wherein each of said plurality of jack assemblies is electrically connected to a corresponding one of said plurality of pin connector blocks by a corresponding one of said plurality of printed coincident pair circuit traces.

15. The modular jack field of claim 14, wherein each of said plurality of printed coincident circuit traces has a predetermined balance impedance.

16. A jack assembly for receiving at least one plug, comprising:
   a jack frame having a plurality of plug receiving sleeves for receiving said at least one plug and a circuit contact end, and wherein said plurality of plug receiving sleeves are stacked with respect to one another;
   a plurality of jack contacts, each of said plurality of jack contacts having a plug contact end and a circuit contact end, and wherein selected ones of said plug contact ends electrically contact; and
   a unitary housing for receiving and retaining said plurality of jack contacts and said jack frame in physical alignment wherein predetermined ones of said plurality of jack contacts electrically contact said at least one plug when fully seated in one of said plurality of plug receiving sleeves.
   said unitary housing having first and second complementary side pieces mateable to form said unitary housing,
      said first complementary side piece of said unitary housing including alignment means for aligning said first and second complementary side pieces for mating to form said unitary housing
      said first complementary side piece further including spring clip means, and
      said second complementary side piece includes means for engaging said spring clip means wherein said first and second complementary side pieces are secured together to form said unitary housing by said spring clip means engaging said engaging means
      each of said first and second complementary side pieces including a first and second plurality of recesses formed therein, and wherein
   said first and second plurality of recesses are formed in said first and second complementary side pieces of said unitary housing to receive said selected ones of said plurality of jack contacts in a predetermined stacked spatial relationship, and wherein said predetermined stacked spatial relationship causes said circuit contact ends of said plurality of jack contacts to be aligned in a predetermined offset relationship along a centerline defined between said first and second complementary side pieces as mated to form said unitary housing and wherein said first and second plurality of recesses receive selected ones of said first and second plurality of jack contacts, respectively, in stacked relation with respect to one another.

17. The jack assembly of claim 16, wherein
   said circuit contact ends of said plurality of jack contacts are disposed to engage a printed circuit.

* * * * *